(12) United States Patent
Suryono

(10) Patent No.: US 8,264,391 B2
(45) Date of Patent: Sep. 11, 2012

(54) AREA EFFICIENT SELECTOR CIRCUIT

(75) Inventor: Yanto Suryono, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 221 days.

(21) Appl. No.: 12/902,493

(22) Filed: Oct. 12, 2010

(65) Prior Publication Data

US 2012/0086591 A1  Apr. 12, 2012

(51) Int. Cl.
*H03M 1/66* (2006.01)

(52) U.S. Cl. ....... 341/145; 712/7; 712/E9.002; 370/386; 370/411; 365/103; 365/63; 365/185.13; 365/185.2; 365/185.33; 257/296; 257/314

(58) Field of Classification Search .......... 341/144–145; 712/7, E9.002; 257/296, 314; 365/103, 63, 365/185.13, 185.2, 185.33; 370/386, 411
See application file for complete search history.

(56) References Cited

U.S. PATENT DOCUMENTS 3,569,958 A * 3/1971 Gabriel .......................... 341/147
6,218,695 B1 * 4/2001 Nachumovsky .............. 257/296

OTHER PUBLICATIONS

Thomas Anastasio, "Bitonic Sorting", Dec. 4, 2003, pp. 1-2.

* cited by examiner

*Primary Examiner* — Lam T Mai
(74) *Attorney, Agent, or Firm* — Robert D. Marshall, Jr.; Wade James Brady, III; Frederick J. Telecky, Jr.

(57) ABSTRACT

A signal converting system has a multi-segment digital to analog converter coupled to an error shaping loop. A control value is received at a vector processor that indicates a number N of elements that are to be selected from a vector having M elements. The elements of the vector are sorted into a bitonic sequence and separated into a larger value group and a smaller value group using a bitonic split. Only the larger value group is sorted into an ordered sequence with repeated bitonic splits when the control value is less than M/2, and N largest elements are selected from the ordered sequence. Only the smaller value group is sorted into an ordered sequence with repeated bitonic splits when the control value is greater than M/2, and N−M/2 largest elements are selected from the ordered sequence.

15 Claims, 6 Drawing Sheets

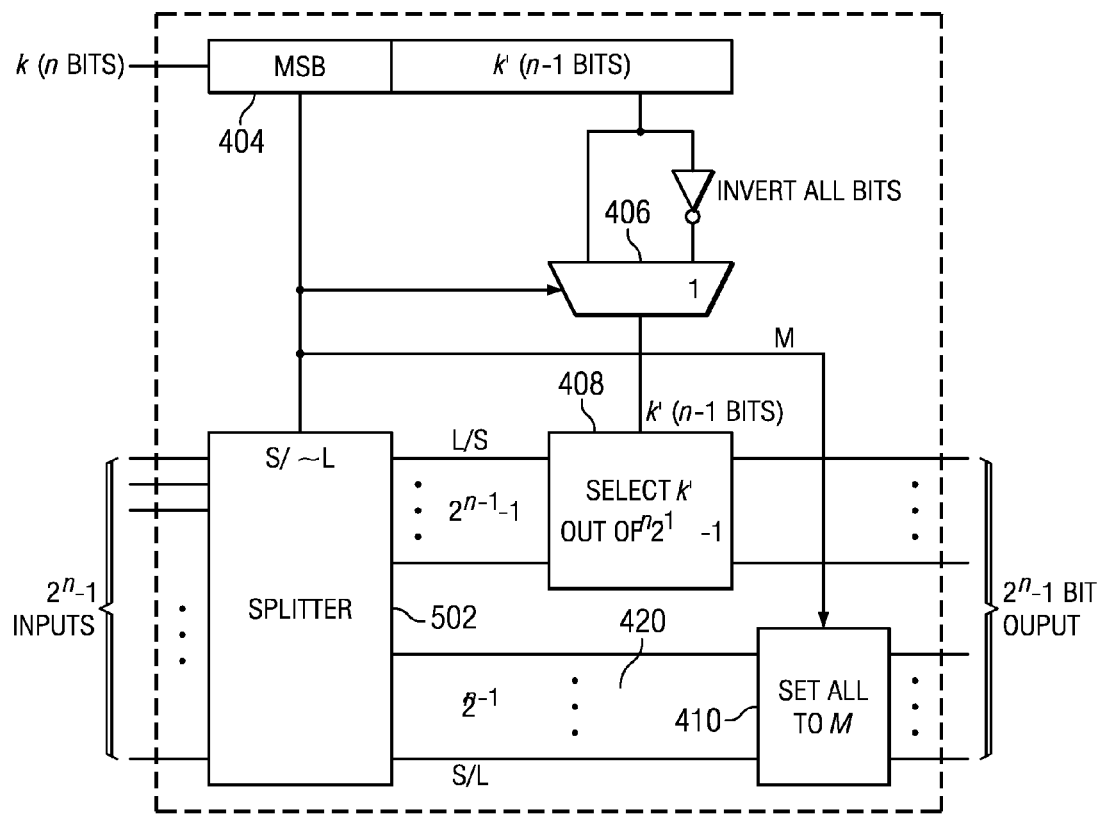
FIG. 5
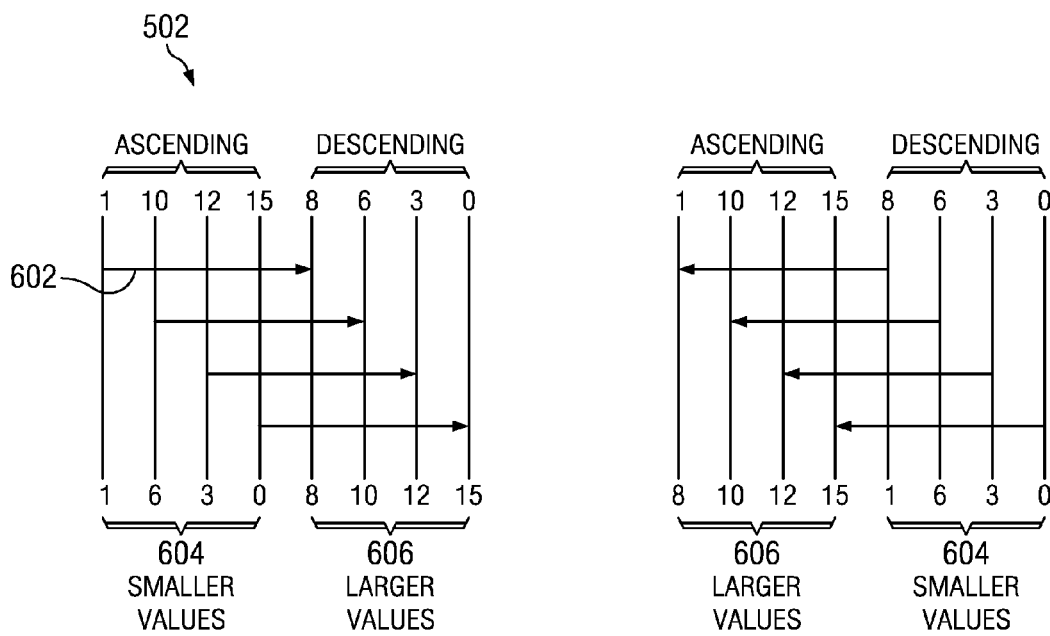
FIG. 6
FIG. 7

AREA EFFICIENT SELECTOR CIRCUIT

FIELD OF THE INVENTION

This invention generally relates to signal converters and more particularly to an area efficient selector circuit for sigma delta based signal converters.

BACKGROUND OF THE INVENTION

Digital to analog converters (DAC) are used to convert a digital representation of a signal into an analog representation of the same signal. DACs are used in a wide variety of applications, ranging from medical and entertainment to communications (both voice and data). Digital to analog converters are electrical circuit devices that convert a digital signal that is a series of multi-bit samples, or numbers, in the digital domain to a continuous signal, such as a voltage or current, in the analog domain. A variety of DAC converter types exist, including a thermometer DAC, R-2R ladder network DAC, segmented DAC, oversampling/interpolating DAC, and pulse-width modulated DAC, for example. Another type is known as a sigma delta or delta sigma ($\Delta\Sigma$) D/A converter. It consists of an "interpolation filter" that is a digital circuit which accepts data at a low rate, inserts zeros at a high rate, and then applies a digital filter algorithm and outputs data at a high rate, a $\Sigma\Delta$ modulator that effectively acts as a low pass filter to the signal but as a high pass filter to the quantization noise, and converts the resulting data to a high speed bit stream, and a 1-bit DAC whose output switches between equal positive and negative reference voltages. The output is filtered in an external analog low pass filter (LPF). It is also possible to use more than one bit in the $\Sigma\Delta$ DAC.

The oversampling in a sigma delta DAC is commonly performed at a multiple of the Nyquist rate ($F_N$) for a given input signal frequency and typically the sampling frequency $F_S$ is 10 to 1000 times $F_N$. In this manner, quantization noise power is spread over a bandwidth equal to the sampling frequency, thereby reducing the noise density in the band of interest. Sigma-delta DACs are commonly used in applications where high resolution with low to moderate conversion rates is required. An advantage of sigma-delta DACs is that the sigma-delta DACs normally make use of single or low multi-bit (typically two, three, four or six bit) quantizer, making the precision requirements of the sigma-delta DAC much lower than other types of DACs that may use quantizers with a large number of bits. However, sigma-delta DACs having a larger number of elements, such as 32 or 64 elements, are now becoming more common. Operating at a frequency greater than the required frequency is commonly referred to as over-sampling and a DAC that is operating at a frequency that is K times greater than the required frequency is referred to as a K-times oversampling DAC.

Mobile audio devices are a ubiquitous fixture of modern society. Cellular telephones, personal music players, portable gaming systems, etc. are constant companions for many people. Music players and gaming systems may make use of $\Sigma\Delta$ DACs to produce the audio signal(s) that are then reproduced by a speaker. Cell phones continue to increase in computer processing capability and sophistication. The basic radio transceiver within the cell phone may make use of a sigma-delta DAC for signal modulation and transmission. The increased memory capacity and computing resources on a cell phone support the installation of various applications, often referred to as "apps" that allow a diverse range of functions to be performed by the cell phone when not being used for conversation. Digital to analog conversion of audio signals to drive speakers/headsets is required by several apps that run on a mobile device and may be performed by a sigma-delta DAC.

BRIEF DESCRIPTION OF THE DRAWINGS

Particular embodiments in accordance with the invention will now be described, by way of example only, and with reference to the accompanying drawings:

FIG. 5 is a block diagram illustrating a selection circuit that performs recursive divide and select using a splitter;

FIG. 6 and 7 illustrate bitonic splitting of a descending sequence of bitonic values;

DETAILED DESCRIPTION OF EMBODIMENTS OF THE INVENTION

Figure 1:
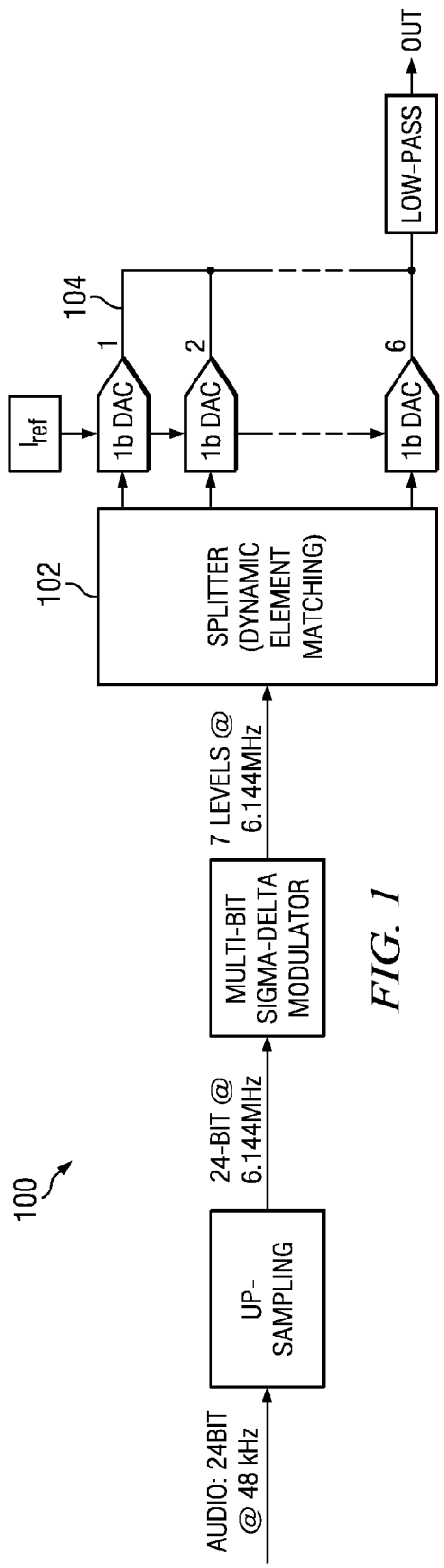
FIG. 1 is a block diagram of a digital to analog converter with mismatch shaping.

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

It is well known that element mismatch is inherent to analog digital to analog converters (DAC); therefore element matching is important for DACs with multi-bit input to enable the DAC to have good linearity. The basic idea is to randomize the elements usage, through simple rotation or any other advanced selection method so that the element mismatch errors are averaged over time which usually yields zero error on average. An embodiment of the present invention is used in an element selection method that involves modulation of the element control signals in a manner similar to delta sigma modulation, so that the element mismatch errors can be endowed with a noise-shaped spectrum.

In various embodiments of the invention, a DAC includes a selector circuit that is configured to select the k largest values specified by a control code from a vector of segment control values. A new control code value is presented each clock cycle representing a number of segments that need to be turned on to represent the next digital value. Therefore, the selector circuit must make a new selection each clock cycle. The selector circuit includes an array of comparators that implements an algorithm that examines the most significant bit of the control code and divides the input vector into two groups. The division of the input vector into two groups is repeated until the number of input vector elements is one and either the largest one is chosen or none is chosen. The algorithm is also applicable in similar problems such as "select k smallest values." In this manner, the number of comparators is minimized which reduces the amount of space needed for the array of comparators and thereby reduces the cost of the DAC.

FIG. 1 is a block diagram of a digital to analog converter 100 illustrating an upsampling module, a sigma delta module (SDM), a static mismatch shaping module 102 and six unit weight DAC segments 104, whose summed output is then fed through a low pass filter module. Mismatch shaping modules are typically referred to as Dynamic Element Matching (DEM) modules. DEM module 102 contains an area efficient selector circuit that is an embodiment of the present invention.

Figure 2:
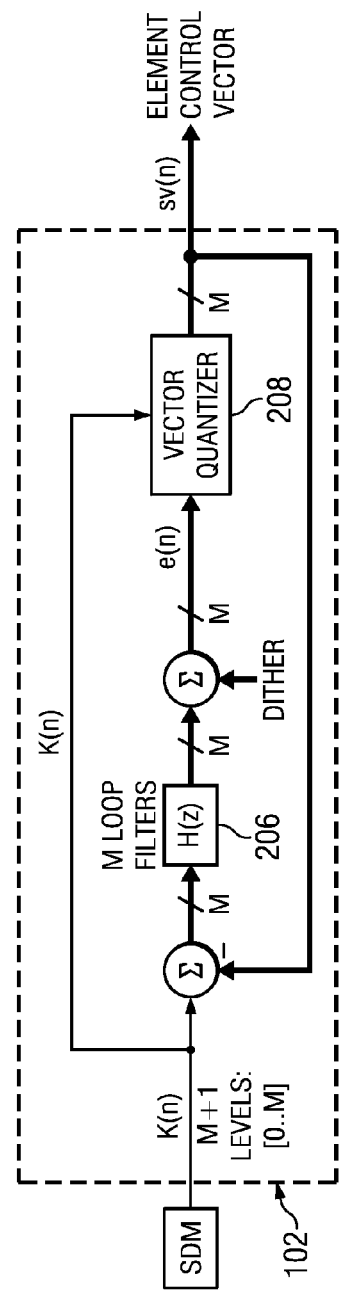
FIG. 2 is a more detailed block diagram of the mismatch shaping module of FIG. 1.

FIG. 2 is a more detailed block diagram of mismatch shaping module 102 that is used in the signal converter of FIG. 1. The SDM updates every sample with the number of segments to use v(n)) in the range 0 . . . M. In the example of FIG. 1, M is six since there are six segments 104. However, in other embodiments the value of M may range between approximately four to as high as 68 or more, for example. Mismatch shaper 102 is a vectorized sigma-delta loop that includes a vector quantizer 208 and M loop filters 206. The loop filters integrate the usage history of each of the M segments. In this embodiment, the vector quantizer looks at the loop filter output plus dither signal vector e (k) and picks the v vector indices with highest values. The output segment control vector sy(k) is formed so that $s_i(k)=1$ for all the picked indices i and zero otherwise. The dither signal may be left out in some embodiments.

Each segment 104 is thus controlled by its own 1-bit sigma-delta modulator that will replicate the SDM signal plus a high-pass shaped quantization error. The high-pass shaping reduces the sensitivity to element mismatch which causes non-uniform weighting. The vector quantizer needs to implement a sorting of M elements and uses an area efficient selector circuit that will be described in more detail below.

Figure 3:
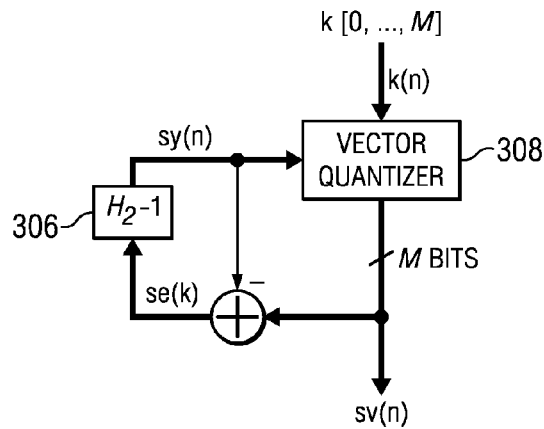
FIG. 3 is a block diagram of another embodiment of a mismatch shaping loop.

All M elements need to be used by the same frequency on average—this eliminates the DC error due to mismatches. Moreover, the mismatch shaper should force each element to toggle in patterns that concentrates the AC mismatch error at high frequencies and reduces the audio band errors FIG. 3 is a block diagram of another embodiment of a simpler mismatch shaping loop in which dithering is not used. In this embodiment, element selection logic implements noise-shaped element usage with a noise transfer function (NTF) of $H_2$. The input to the logic is the digital code k(n), which takes on values from zero to M. The number of levels in the DAC is M+1. The output of the system is the selection vector, sv(n), a collection of bits that enable individual elements in the unit element array. The number of 1s in output vector sv(n) equals to k(n).

Vector quantizer 308 uses the information in sy(n) vector, a time-varying collection of M digital numbers, to select which k(n) elements to enable. The sy(n) vector represents the desired usage of each of the M unit elements so selecting elements with the largest sy(n) components results in the least selection error, se(n)=sv(n)−sy(n). The error vector se(n) is fed back to the quantizer input after undergoing filtering by the $H_2-1$ filter 306 which shapes the error. Each loop filter 306 functions as an integrator and accumulates a respective element of the se(k) error signal over time.

The number of bits in each sy element depends on the resolution desired for a particular embodiment. When only a few bits are used, there is a higher chance of aliasing to a same number which might otherwise be different if more bits are used. This may result in making random or deterministic decisions more often, and result in less optimal performance. In the present embodiment, 6-bit values in Q1.5 format are used.

The operation of vector quantizer 308 or 208 is to take the sv(n) vector with a fixed number 2n−1 of values {v}, and a control value k (0≦k≦2n−1), and select the k largest values among {v} by marking their position in the original {v}, usually by outputting a 0-1 vector sy(n) with 1 at the positions of the indicated values and 0 at everywhere else.

For example: given a set {2, 1, 0, 5, 6, 3, 4} and a control value k=3, the output vector is {0, 0, 0, 1, 1, 0, 1}.

The conventional, straight-forward solution to the problem is to sort {v} (ascending or descending, it does not matter) and choose the k largest values after that. After sorting, the selection process becomes trivial, but there are two drawbacks with this approach. The first one is the sort process itself can be very computationally expensive while at the end the sorted values are not needed, only their positions. The second drawback is, that since the positions are needed, and not the values themselves, a circuit is required to translate these position values to the actual vector positions.

For example: given a set {2, 1, 0, 5, 6, 3, 4} and a value k=3, Before sort:
Values={2, 1, 0, 5, 6, 3, 4} Indexes={0, 1, 2, 3, 4, 5, 6}
After descending sort:
Values={6, 5, 4, 3, 2, 1, 0} Indexes={4, 3, 6, 5, 0, 1, 2}
Then, output a vector with 1s at index 4, 3, 6 and 0s at everywhere else. Thus, the output vector is {0, 0, 0, 1, 1, 0, 1}.

Vector quantizer 208, 308 has circuitry that implements a selection scheme that exploits the fact that given a 2n−1 number of values, only 2n−1−1 values need to be selected, at most, regardless of value of the control value k. If the value of k exceeds 2n−1−1, the select criteria is simply reversed and the result is adjusted after that. For example, given a set {2, 1, 0, 5, 6, 3, 4} and a value k=4, instead of selecting the four largest values, the 7−4=3 smallest values are selected, resulting in a vector {1, 1, 1, 0, 0, 0, 0}. The final output is then just the inverse of this vector, which is {0, 0, 0, 1, 1, 1, 1}.

Notice here that since the number of values in the given set is 2n−1, determination of whether the value k exceeds 2n−1−1 or not can be done by examining only the most significant bit (MSB) of k, and when k exceeds 2n−1−1, the reversed selection counts of (2n−1)−k can be calculated by inverting all bits expressed by k.

Thus, the implementations of this selection scheme will reduce the size of the problem by half at the cost of only a few inverters.

Note also that this divide to half strategy can be repeated until a point is reached of "select one or none out of one", which is trivial to solve.

Figure 4:
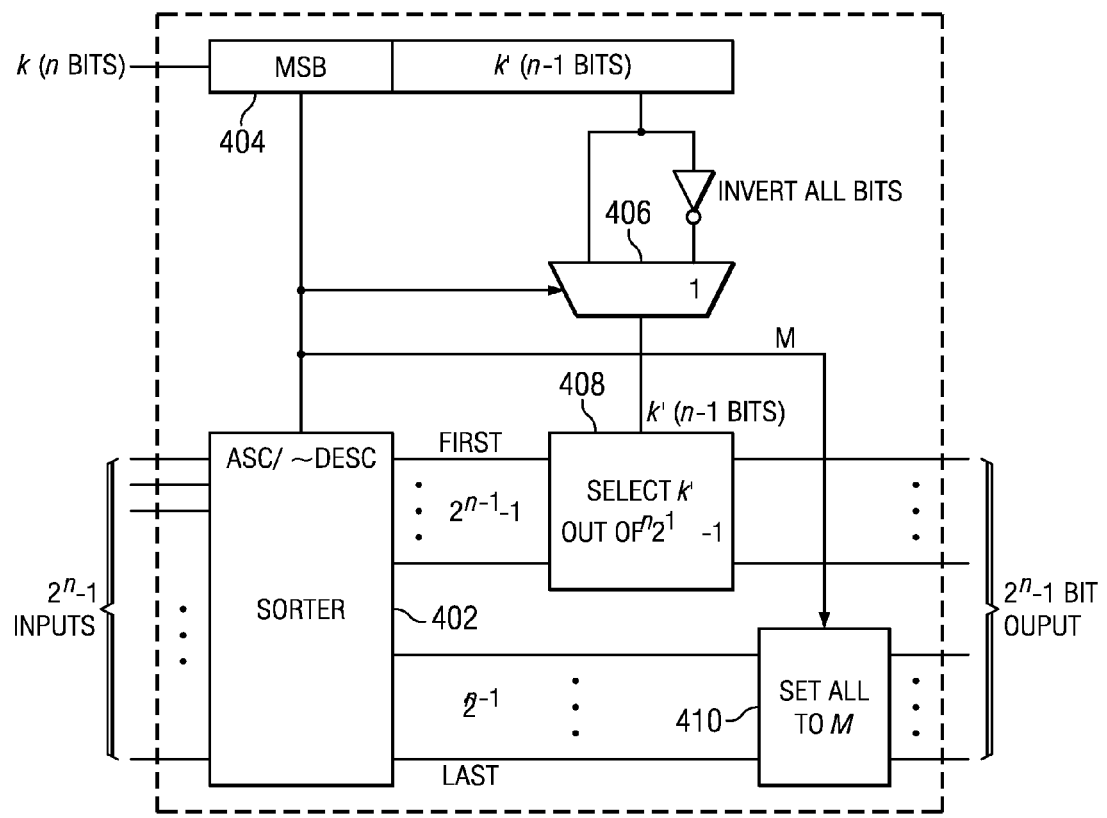
FIG. 4 is a block diagram illustrating a selection circuit that performs recursive divide and select using a full sort.

FIG. 4 is a block diagram illustrating a selection circuit that performs recursive divide and select using a full sort. Sorter 402 sorts the inputs into ascending or descending order based on the MSB of the control input k. Multiplexor 406 inverts the remaining bits of the control input k when the MSB has a value of "1". Selector circuit then recursively selects the 2n−1−1 largest values of only one half of the sorted input vector. Circuit 410 sets the remaining one half to the sorted input elements to zero when the MSB equals zero and to one when the MSB equals one.

FIG. 5 is a block diagram illustrating a selection circuit that performs recursive divide and select using a splitter. While it is required to divide the inputs into two groups, there is no need to faithfully sort the inputs in order to split them. All that is needed is to split the input into two groups where the values in one group are smaller or larger than any other value in the other group. The splitter 502 outputs the larger values to the upper group and smaller values to the lower group when the MSB 404 of k is 0 and the reverse otherwise. This is due to the fact that if the MSB is 0, the k must be less than 2n−1 and since larger values are to be selected, the 2n−1 smaller values have no chance to be selected.

Now the problem is reduced from sorting into the problem of splitting. To correctly split the input values into larger-value group and smaller-value group, the input values are first split and then the first half is sorted ascending and the second half is sorted descending. This will create a sequence of bitonic descending values. Then a bitonic split may be done on this sequence which will yield desired larger-value group and smaller-value group.

FIGS. 6 and 7 illustrate bitonic splitting of a descending sequence of bitonic values. Each arrow, such as arrow 602, in the figure represents a compare and swap circuit. It accepts a value at each of its ends and outputs the smaller value at its start point and the larger value at its endpoint. If the input is in bitonic order then with only n comparators we can split the n inputs into smaller-value and larger-value groups. In FIG. 6, the smaller group 604 is formed on the left side and the larger group 606 is formed on the right side. In FIG. 7, the smaller group 604 is formed on the right side and the larger group 606 is formed on the left side.

When the number of inputs is odd, the last value of the group with more number of values will not have a partner to compare. Thus, in this case the direction of sorting the original sequence must be restricted to make sure that this value will not have to switch groups.

Figure 8:
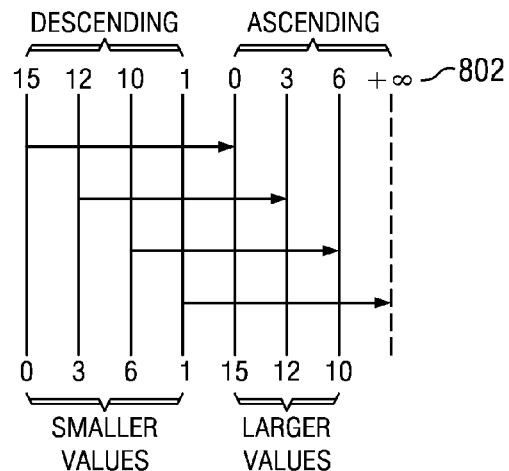
FIG. 8 illustrates a bitonic split of an odd number of elements.

Referring back to FIG. 5, if the MSB is 0, then the group 420 of 2n−1 values needs to be the smaller-value group. Thus, if the MSB is 0, then the input sequence is sorted into bitonic increasing order. Doing so, since the second half group is sorted ascending, a +∞ may be added after the last value to make the number of values in the sequence even. The bitonic split is then done such that the values in the first half become the smaller values. The first half group will have one value more than the second half after the +∞ is dropped. If the MSB is 1 the input sequence is sorted into bitonic decreasing order and −∞ is temporarily added instead. FIG. 8 illustrates a bitonic split of an odd number of elements in which +∞ (802) is temporarily added prior to performing the bitonic split.

Interestingly, a bitonic split over a bitonic sequence will result in groups that are again bitonic sequences. That means that a sort is required only once, and the number of values to sort is only half the original number of inputs. Considering sorting with an optimal known sorting network, then in case of 15 inputs, sixteen comparators are needed to sort seven values, nineteen comparators are needed to sort eight values and seven comparators are needed to do the bitonic split, totaling forty-two comparators. This number is much lesser than the number of comparators needed to sort fifteen values at once, which is known to be at least fifty-six; for example, using Green's construction for sixteen inputs, with comparators for sixteenth value removed.

Figure 9:
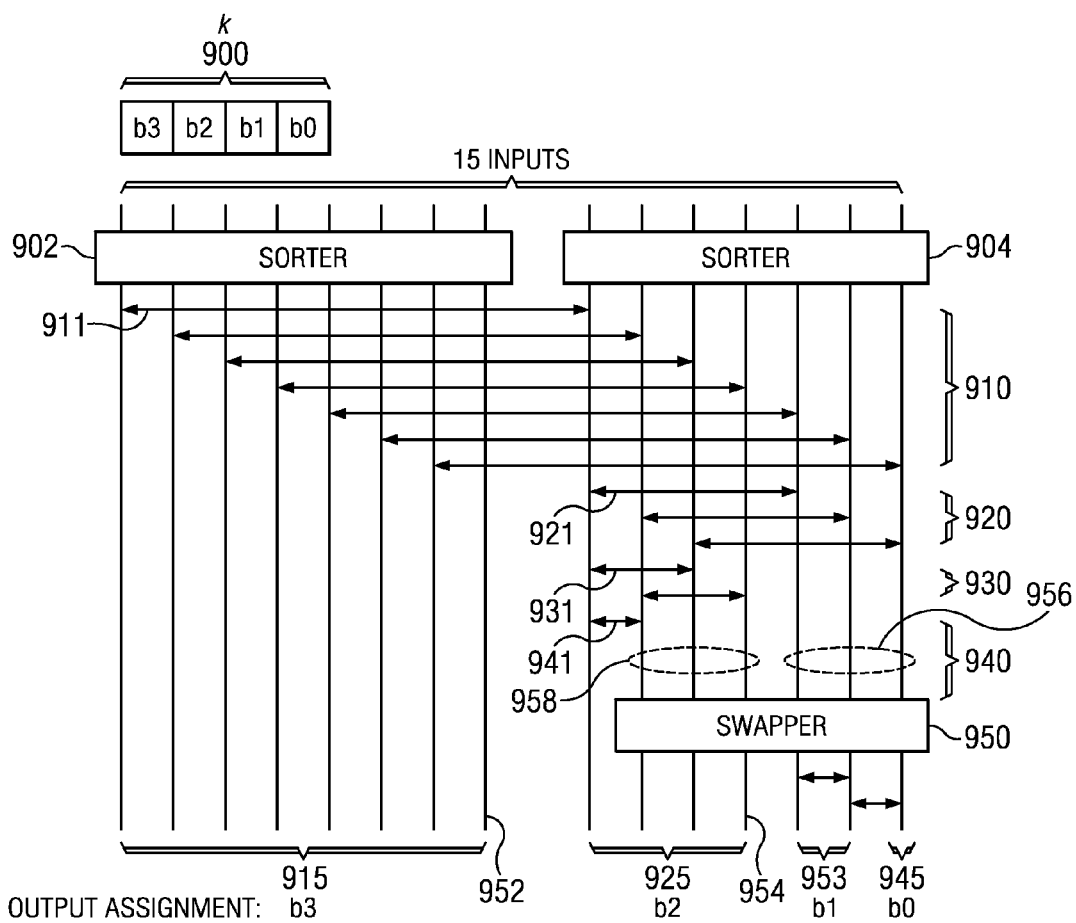
FIG. 9 is a schematic illustration of an area efficient selector circuit using bitonic splits.

FIG. 9 is a schematic illustration of an area efficient selector circuit using bitonic splits. This illustrates a complete implementation for the case of fifteen inputs (n=4). Sorter 902 receives eight of the fifteen inputs while sorter 904 receives the remaining seven inputs. Together, sorter 902 and 904 form a split sorter that sorts the inputs into a bitonic increasing sequence when the MSB (b3) of control value k (900) is 0. Since the second half group is sorted ascending, a +∞ may be added after the last value to make the number of values in the sequence even. The bitonic split is then done such that the values in the first half become the smaller values. The first half group will have one value more than the second half after the +∞ is dropped. If the MSB (b3) is 1 the input sequence is sorted into bitonic decreasing order and −∞ is temporarily added instead.

In either case, the result of comparing to −∞ or +∞ is predictable, so a comparison does not need to actually be performed. In a first rank of compare and swap circuits (910), each arrow, such as 911, represents a compare and swap circuit that can be selected to operate in either direction, based on the MSB (b3).

Similarly, in a second rank of compare and swap circuits (920), each arrow, such as 921, represents a compare and swap circuit that can be selected to operate in either direction, based on bit b2, which is now the MSB of the reduced size group. In a third rank of compare and swap circuits (930), each arrow, such as 931, represents a compare and swap circuit that can be selected to operate in either direction, based on bit b1, which is now the MSB of the reduced size group. In a fourth rank of compare and swap circuits (940), arrow 931 represents a compare and swap circuit that can be selected to operate in either direction, based on bit b0, which is now the MSB of the reduced size group.

In embodiments having more than fifteen inputs, additional ranks of compare and swap circuits are provided and controlled by the decreasing MSB in a similar manner.

Swapper 950 is for swapping the left three groups with right three groups when needed. For fifteen inputs, the input cannot be split into two groups with the same number of inputs in each group. Thus, if FIG. 9, the left block always has uncompared input 952. The right block then will have a virtual input of +∞0 or −∞, such as illustrated in FIG. 8. When b3 is 1, the left block has larger values and the virtual input =−∞ is assumed for the right block. Otherwise, the left block has smaller values and the virtual input =+∞.

The bitonic splitting within the right block can be done with b2 to determine direction and keeping the virtual input value in mind. Alternatively, by using b3 and neglecting the virtual input, since smaller-left or smaller-right condition will be the same when split with the same b3, the virtual input can be ignored. FIG. 9 illustrates the latter scheme, that is, splitting the right block with b3.

At the end of splitting, a determination of whether splitting is being done in correctly by comparing bits b2 and b3. If bit b2 is the same as bit b3, then the left block (958) should be next to group b3 (915) since the b3 group (915) was on the left side at first split. Otherwise, the right block 956 should be next to b3 group (915). Swapper 950 swaps blocks 956, 958 as needed.

Each input value is a signed value. During the bitonic splits, the comparators compare two signed integers. In this embodiment, the input values are six bit values in Q1.5 format.

At the end of sorting, the original MSB may be used to assign the output. For example, in FIG. 9, all output assigned to b3 blocks 915 are assigned bit b3 value (0/1), b2 block 925 with bit b2 value, and so on. In normal sorting, a 1 is assigned from the left-most (or right-most) as many as originally required, and this requires another logic implementation, such as thermometer encoding logic.

During the entire sort operation, an index representing the original vector position of each element is carried along with the sorted value so that the output vector sy(n) can be easily formed by using the index values to determine original positions of the sorted elements.

The implementation illustrated in FIG. 9 uses fifty comparators and this number is less than that required using a known optimal sorting network (9% less comparators). The gain is even larger with higher number of inputs. For example, for a system with 31 inputs, 153 comparators are required for an implementation using bitonic splits as described herein compared to 206 comparators for a known optimal sorting network, which results in 25% fewer comparators.

The optimal number of comparators given n inputs remains a fundamental open problem so it is difficult to mathematically express the percentage savings the scheme described herein will produce when compared to an implementation using a full sorting network.

This scheme is a selection algorithm which makes use of a partial sort and a divide and conquer method rather than an attempt to find an optimal sorting network. It does make use of an optimal sorting network for the front-end sorter 902, 904, so any discoveries in optimal sorting topology may also be applied to embodiments of the present invention.

Figure 10:
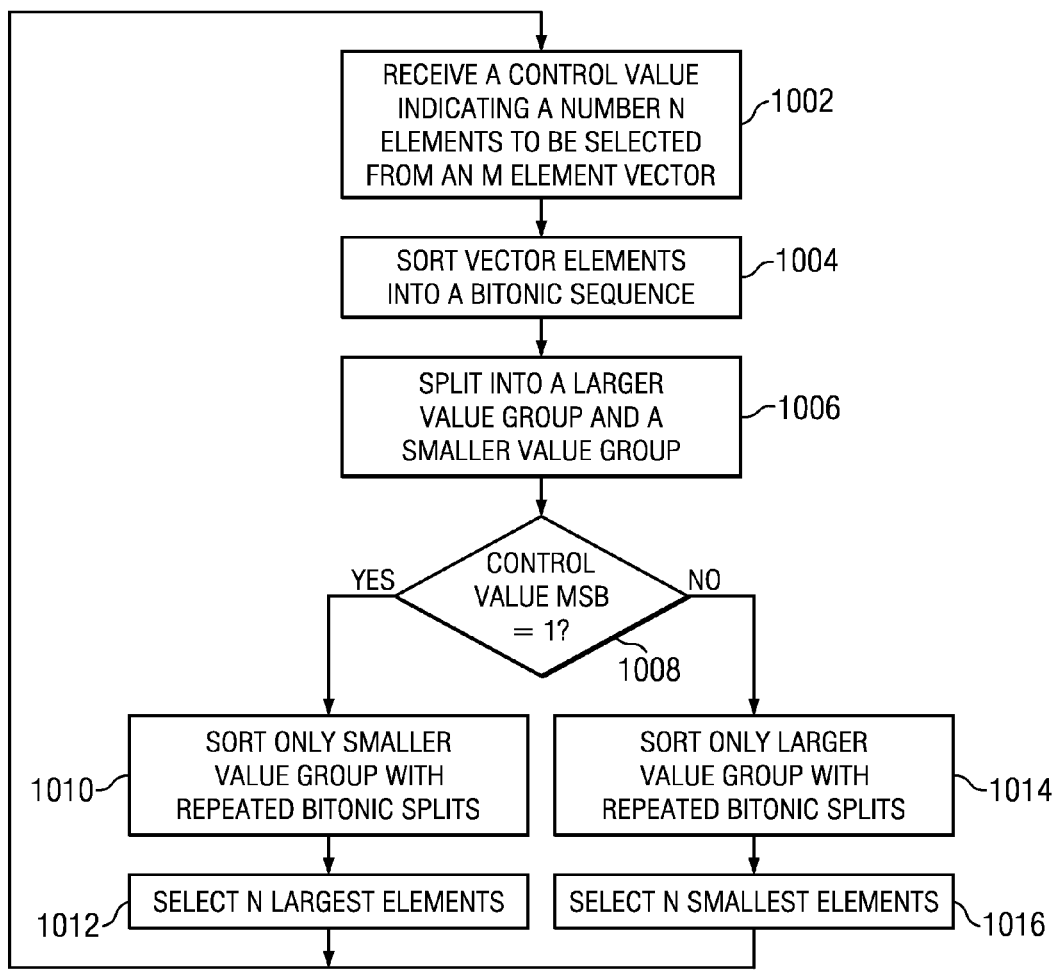
FIG. 10 is a flow diagram illustrating operation of a bitonic split selection scheme.

FIG. 10 is a flow diagram illustrating operation of a bitonic split selection scheme, as described above. A control value is received (1002) at a vector processor that indicates a number N elements that are to be selected from a vector having M elements.

The elements of the vector are sorted (1004) into a bitonic sequence in a first clock cycle of the vector processor. The elements of the vector are then separated (1006) into a larger value group and a smaller value group in the same first clock cycle with a bitonic split using M/2 comparators and selectors, wherein the elements in the larger value group are larger than any of the elements in the smaller value group.

When the control value is less than M/2 (1008), only the larger value group is sorted (1010) into an ordered sequence in the same first clock cycle with repeated bitonic splits using a ranked set of comparators and selectors. The N largest elements are selected (1012) from the ordered sequence.

When the control value is greater than M/2 (1008), only the smaller value group is sorted (1014) into an ordered sequence in the same first clock cycle with repeated bitonic splits using the ranked set of comparators and selectors. N−M/2 largest elements are selected (1016) from the ordered sequence and all of the elements in the larger value group.

The entire selection process is then repeated on the clock cycle of the vector processor.

A most significant bit of the control value is used to control a direction of the M/2 comparators and selectors.

A descending least significant bit is used to control a direction of each rank of the ranked set of comparators and selectors.

Figure 11:
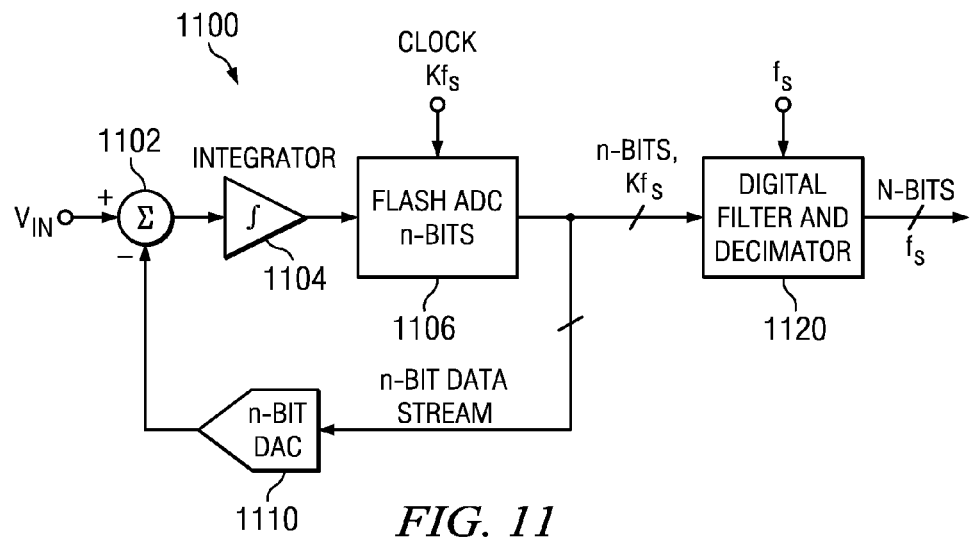
FIG. 11 is a block diagram of a signal converter that performs analog to digital conversion.

FIG. 11 is a block diagram of a signal converter that performs analog to digital conversion using an embodiment of the present invention.

An analog to digital converter (ADC) has the same problem as a DAC since an ADC has a feedback DAC that needs mismatch shaping.

An analog signal is applied to the input of summing node 1102. Integrator 1104 integrates the output of the summing node and flash analog to digital converter 1106 converts the output of integrator 1104 to an n-bit digital value. The flash converter is clocked at a rate that is K times the desired digital output rate.

This n-bit data stream is then applied to n-bit DAC 1110 which is embodied as a data converter as described herein. In particular, it includes a quantizer with a feedback loop configured to generate a control signal responsive to the stream of n-bit data values. A control value is received that indicates a number N of elements that are to be selected from a vector having M elements. The elements of the vector are sorted into a bitonic sequence and separated into a larger value group and a smaller value group using a bitonic split. Only the larger value group is sorted into an ordered sequence with repeated bitonic splits when the control value is less than M/2, and N largest elements are selected from the ordered sequence. Only the smaller value group is sorted into an ordered sequence with repeated bitonic splits when the control value is greater than M/2, and N−M/2 largest elements are selected from the ordered sequence The control signal is coupled to a multi-segment DAC that produces an analog output signal by summing the outputs of each of the multiple segments that is an analog representation of the stream of n-bit data values.

The analog output signal of DAC 1110 is then provided to summer 1102 as an error signal. DAC 1110 may be implemented as described with respect to FIGS. 1-9, for example.

The n-bit data stream produced by flash ADC 1106 is filtered and decimated by digital filter and decimator 1120 to produce the final digital output stream that has a higher precision but a lower frequency than the output of flash ADC 1106.

SYSTEM EXAMPLE

Figure 12:
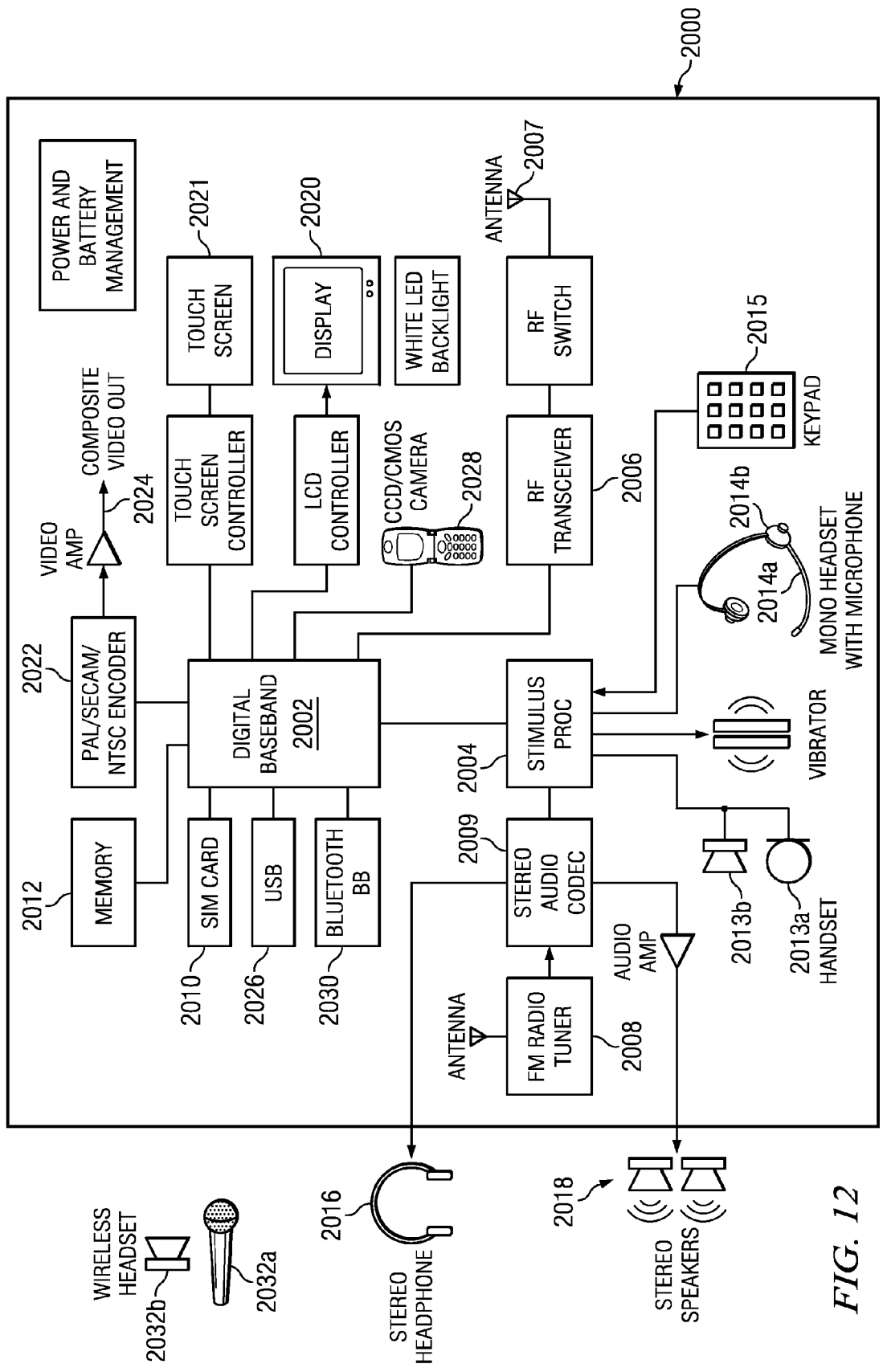
FIG. 12 is a block diagram of a mobile device that uses the signal converter of FIG. 1.

FIG. 12 is a block diagram of mobile cellular phone 2000 for use in a cellular network. Digital baseband (DBB) unit 2002 can include a digital processing processor system (DSP) that includes embedded memory and security features. Stimulus Processing (SP) unit 2004 receives a voice data stream from handset microphone 2013a and sends a voice data stream to handset mono speaker 2013b. SP unit 2004 also receives a voice data stream from microphone 2014a and sends a voice data stream to mono headset 2014b. Usually, SP and DBB are separate ICs. In most embodiments, SP performs processing based on configuration of audio paths, filters, gains, etc being setup by software running on the DBB. In an alternate embodiment, SP processing is performed on the same processor that performs DBB processing. In another embodiment, a separate DSP or other type of processor performs SP processing.

SP unit 2004 may include a digital to analog converter as described in more detail with respect to FIGS. 1-9 for generating audio signals for headset 2014b and speaker 2013b from digital signals processed by DBB from radio signals received by RF transceiver 2006. In particular, it includes a quantizer with a feedback loop configured to generate a control signal responsive to the stream of n-bit data values from DBB 1002 using bitonic splits as described in more detail above. The control signal is coupled to a multi-segment DAC that produces an analog output signal by summing the outputs of each of the multiple segments that is an analog representation of the stream of n-bit data values.

SP unit 2004 may also include an analog to digital converter as described in more detail with respect to FIG. 11 for converting an audio analog signal from microphone 2014a and 2013a to a digital signal that is then processed by DBB unit 1002 for transmission via RF transceiver 2006.

RF transceiver 1106 is a digital radio processor and includes a receiver for receiving a stream of coded data frames from a cellular base station via antenna 1107 and a transmitter for transmitting a stream of coded data frames to the cellular base station via antenna 1107. RF transceiver 1106 is connected to DBB 1102 which provides processing of the frames of encoded data being received and transmitted by cell phone 1100.

DBB unit 2002 may send or receive data to various devices connected to universal serial bus (USB) port 2026. DBB 2002 can be connected to subscriber identity module (SIM) card

2010 and stores and retrieves information used for making calls via the cellular system. DBB 2002 can also connect to memory 2012 that augments the onboard memory and is used for various processing needs. DBB 2002 can be connected to Bluetooth baseband unit 2030 for wireless connection to a microphone 2032a and headset 2032b for sending and receiving voice data. DBB 2002 can also be connected to display 2020 and can send information to it for interaction with a user of the mobile UE 2000 during a call process. Display 2020 may also display pictures received from the network, from a local camera 2026, or from other sources such as USB 2026. DBB 2002 may also send a video stream to display 2020 that is received from various sources such as the cellular network via RF transceiver 2006 or camera 2026. DBB 2002 may also send a video stream to an external video display unit via encoder 2022 over composite output terminal 2024. Encoder unit 2022 can provide encoding according to PAL/SECAM/NTSC video standards. In some embodiments, audio codec 2009 receives an audio stream from FM Radio tuner 2008 and sends an audio stream to stereo headset 2016 and/or stereo speakers 2018. In other embodiments, there may be other sources of an audio stream, such a compact disc (CD) player, a solid state memory module, etc.

Other Embodiments

While the invention has been described with reference to illustrative embodiments, this description is not intended to be construed in a limiting sense. Various other embodiments of the invention will be apparent to persons skilled in the art upon reference to this description. For example, this algorithm can be used, but not limited to the dynamic element matching circuit of a delta sigma modulator.

While a mobile handset has been described, embodiments of the invention are not limited to cellular phone devices. Various personal devices such as audio players, video players, radios, televisions, personal digital assistants (PDA) may use an embodiment of the invention to produce superior analog to digital conversion to drive an analog reproduction device, such as a speaker, headset, etc.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. A method for selecting a set of elements in a vector, the method comprising:
   receiving a control value at a vector processor that indicates a number N elements that are to be selected from an input vector having M elements;
   sorting the elements of the input vector into a bitonic sequence in a first clock cycle of the vector processor;
   separating the elements of the bitonic sequence into a larger value group and a smaller value group in the same first clock cycle with a bitonic split, wherein the elements in the larger value group are larger than any of the elements in the smaller value group;
   sorting only the larger value group into an ordered sequence in the same first clock cycle with repeated bitonic splits when the control value is less than M/2 and selecting N largest elements from the ordered sequence; and
   sorting only the smaller value group into an ordered sequence in the same first clock cycle with repeated bitonic splits when the control value is greater than M/2 and selecting N−M/2 largest elements from the ordered sequence and all of the elements in the larger value group.

2. The method of claim 1, further comprising using M/2 comparators and selectors to separate the elements of the bitonic sequence into a larger value group and a smaller value group in the same first clock cycle with a bitonic split.

3. The method of claim 1, further comprising using a ranked set of comparators and selectors to sort either the larger value group or the smaller value group.

4. The method of claim 2, further comprising using a most significant bit of the control value to control a direction of the M/2 comparators and selectors.

5. The method of claim 3, further comprising using a descending least significant bit of the control value to control a direction of each rank of the ranked set of comparators and selectors.

6. The method of claim 1, further comprising forming an output vector from the vector processor, wherein each element of the output vector corresponding to a selected element of the input vector is set to a first value and all remaining elements of the output vector are set to second value.

7. A signal converting system comprising:
   a vector processor with an input for receiving an input vector having M elements and another input for receiving a control value that indicates a number N elements that are to be selected from the vector, wherein the vector processor comprises:
      a split sorter configured to sort the received vector into a bitonic sequence;
      a set of M/2 comparators and selectors configured to perform a bitonic split on the bitonic sequence to separate the bitonic sequence into a larger group and a smaller group; and
      a ranked set of comparators and selectors configured to sort only the larger value group into an ordered sequence with repeated bitonic splits when the control value is less than M/2 and to select N largest elements from the ordered sequence, and to sort only the smaller value group into an ordered sequence with repeated bitonic splits when the control value is greater than M/2 and to select N−M/2 largest elements from the ordered sequence and all of the elements in the larger value group.

8. The signal converting system of claim 7, wherein a most significant bit of the control value is used to control a direction of the M/2 comparators and selectors.

9. The signal converting system of claim 7, wherein a descending least significant bit of the control value is used to control a direction of each rank of the ranked set of comparators and selectors.

10. The signal converting system of claim 7, wherein the vector processor further comprises a swapper module coupled to the ranked set of comparators and selectors.

11. The signal converting system of claim 7, wherein the vector processor has an output configured to provide an output vector having M elements, wherein each element of the output vector corresponding to a selected element of the input vector is set to a first value and all remaining elements of the output vector are set to second value.

12. The signal converting system of claim 7 further comprising a set of unit weight segments controllably coupled to the output of the vector processor to form an analog output signal, wherein the signal converting system is a digital to analog converter.

13. The signal converting system of claim 12 comprised within a mobile device, wherein the mobile device further comprises an analog reproduction device coupled to the analog output of the signal converting system.

14. A signal converting system, comprising:
- a digital to analog converter (DAC), wherein the DAC comprises:
  - a vector processor with an input for receiving an input vector having M elements and another input for receiving a control value that indicates a number N elements that are to be selected from the vector, wherein the vector processor comprises:
    - a split sorter configured to sort the received vector into a bitonic sequence;
    - a set of M/2 comparators and selectors configured perform a bitonic split on the bitonic sequence to separate the bitonic sequence into a larger group and a smaller group;
    - a ranked set of comparators and selectors configured to sort only the larger value group into an ordered sequence with repeated bitonic splits when the control value is less than M/2 and to select N largest elements from the ordered sequence, and to sort only the smaller value group into an ordered sequence with repeated bitonic splits when the control value is greater than M/2 and to select N−M/2 largest elements from the ordered sequence and all of the elements in the larger value group; and
  - an output configured to provide an output vector having M elements, wherein each element of the output vector corresponding to a selected element of the input vector is set to a first value and all remaining elements of the output vector are set to second value; and
  - a set of unit weight segments controllably coupled to the output of the vector processor, the set of unit weight segments configured to form an analog output signal.

15. The signal conversion system of claim 14, being an analog to digital converter (ADC), wherein the ADC further comprises:
- a summer coupled to receive the analog output signal and an analog input signal;
- an integrator coupled to an output of the summer;
- a flash converter coupled to an output of the integrator, wherein an output of the flash converter provides the control value to the vector processor; and
- a digital filter coupled to an output of the flash converter, the digital filter having an output for providing a digital output signal.

* * * * *